(12) United States Patent
Shen (10) Patent No.: US 12,108,569 B2
(45) Date of Patent: Oct. 1, 2024

(54) HEAT DISSIPATION CONNECTION STRUCTURE OF HANDHELD DEVICE

(71) Applicant: ASIA VITAL COMPONENTS CO., LTD., New Taipei (TW)

(72) Inventor: Ching-Hang Shen, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 16/867,567

(22) Filed: May 6, 2020

(65) Prior Publication Data

US 2021/0352827 A1    Nov. 11, 2021

(51) Int. Cl.
*H05K 7/20* (2006.01)
*F28F 21/08* (2006.01)

(52) U.S. Cl.
CPC ....... *H05K 7/20336* (2013.01); *F28F 21/081* (2013.01); *F28F 21/083* (2013.01); *F28F 21/085* (2013.01)

(58) Field of Classification Search
CPC .. H05K 7/20336; H05K 7/20; H05K 7/20445; H05K 7/20463; F28F 21/081; F28F 21/083; F28F 21/085; F28F 21/08; F28D 15/04; F28D 15/0233; H01L 23/427; H04M 1/0249; H04M 1/0226; H04M 10/6552
See application file for complete search history.

(56) References Cited

U.S. PATENT DOCUMENTS

| | | | | |
|---|---|---|---|---|
| 2015/0342089 | A1* | 11/2015 | Kim | H05K 7/20336 361/700 |
| 2016/0133541 | A1* | 5/2016 | Ozawa | H01L 23/4334 257/773 |
| 2017/0055367 | A1* | 2/2017 | Shen | G06F 1/1626 |
| 2017/0059254 | A1* | 3/2017 | Zhang | F28D 15/0233 |
| 2019/0132993 | A1 | 5/2019 | Sutherland | |
| 2019/0281729 | A1* | 9/2019 | Inagaki | G06F 1/20 |

(Continued)

FOREIGN PATENT DOCUMENTS

| | | |
|---|---|---|
| CN | 109890174 A | 6/2019 |
| JP | 3197757 U * | 6/2015 |
| JP | 2017025365 A * | 2/2017 |

(Continued)

OTHER PUBLICATIONS

Search Report dated Sep. 24, 2020 issued by Taiwan Intellectual Property Office for counterpart application No. 109111634.

(Continued)

*Primary Examiner* — Harry E Arant
(74) *Attorney, Agent, or Firm* — Bradley J. Thorson; DeWitt LLP (57) ABSTRACT

A heat dissipation connection structure of handheld device includes an outer frame main body and a two-phase flow heat exchange unit. The outer frame main body has a hollow receiving space at the center. The outer frame main body surrounds the hollow receiving space. The two-phase flow heat exchange unit is disposed in the hollow receiving space and connected with the outer frame main body by means of an injection molding structure member, whereby the outer frame main body and the two-phase flow heat exchange unit can be quickly and securely connected with each other.

9 Claims, 7 Drawing Sheets

(56) References Cited

U.S. PATENT DOCUMENTS

2020/0025460 A1\* 1/2020 Aoki ................... F28D 15/0275

FOREIGN PATENT DOCUMENTS

| TW | M494951 U | 2/2015 |
| TW | 201530076 A | 8/2015 |
| TW | M548416 U | 9/2017 |
| TW | M575647 U | 3/2019 |
| WO | 2019131589 A1 | 7/2019 |

OTHER PUBLICATIONS

Search Report dated May 16, 2022 issued by China National Intellectual Property Administration for counterpart application No. 2020102630595.

\* cited by examiner

HEAT DISSIPATION CONNECTION STRUCTURE OF HANDHELD DEVICE

BACKGROUND OF THE INVENTION

1. Field of the Invention

The present invention relates generally to a heat dissipation connection structure of handheld device, and more particularly to a heat dissipation connection structure of handheld device, in which an injection molding structure member made by means of integral insert injection molding is used as a connection structure to connect the outer frame and the two-phase flow heat exchange unit of the handheld device.

2. Description of the Related Art

Along with the multiplication of the performance and processing speed of the handheld mobile device, the internal electronic components of the handheld mobile device generate higher heat, which is conducted to the entire body of the handheld mobile device. As a result, a user's hand will feel hot and the electronic components may be overheated to crash or burn down. Therefore, it is necessary to dissipate the heat generated by the internal electronic components.

The current handheld mobile device generally has a middle frame or a case as a base seat for supporting the respective units such as the electronic components, the battery and the touch screen. The middle frame or the case is generally an integrated structure body made by means of mechanical processing. In order to dissipate the heat, the manufacturers in this field often additionally arrange assistant heat transfer members such as copper foil, graphite sheet, thin heat pipe and two-phase flow heat exchange unit in the mobile device to spread and dissipate the heat generated by the internal electronic components or conduct the heat to a remote end to dissipate the heat.

The integrated middle frame case 4 is made of one single material by means of mechanical processing such as milling or punching. The single material is selectively aluminum or aluminum alloy or copper alloy. In the case that a lightweight material is selectively used, the structural strength of the handheld device will be deteriorated. On the other hand, in the case that a material with better heat conductivity, such as pure copper, is selectively used, the heat conduction efficiency is enhanced, but the handheld device will be overweight. Moreover, the pure copper is soft and has poor structural strength. Therefore, the middle frame case 4 made of one single material cannot provide good heat conduction performance and sufficient structural strength at the same time.

Figure 7:
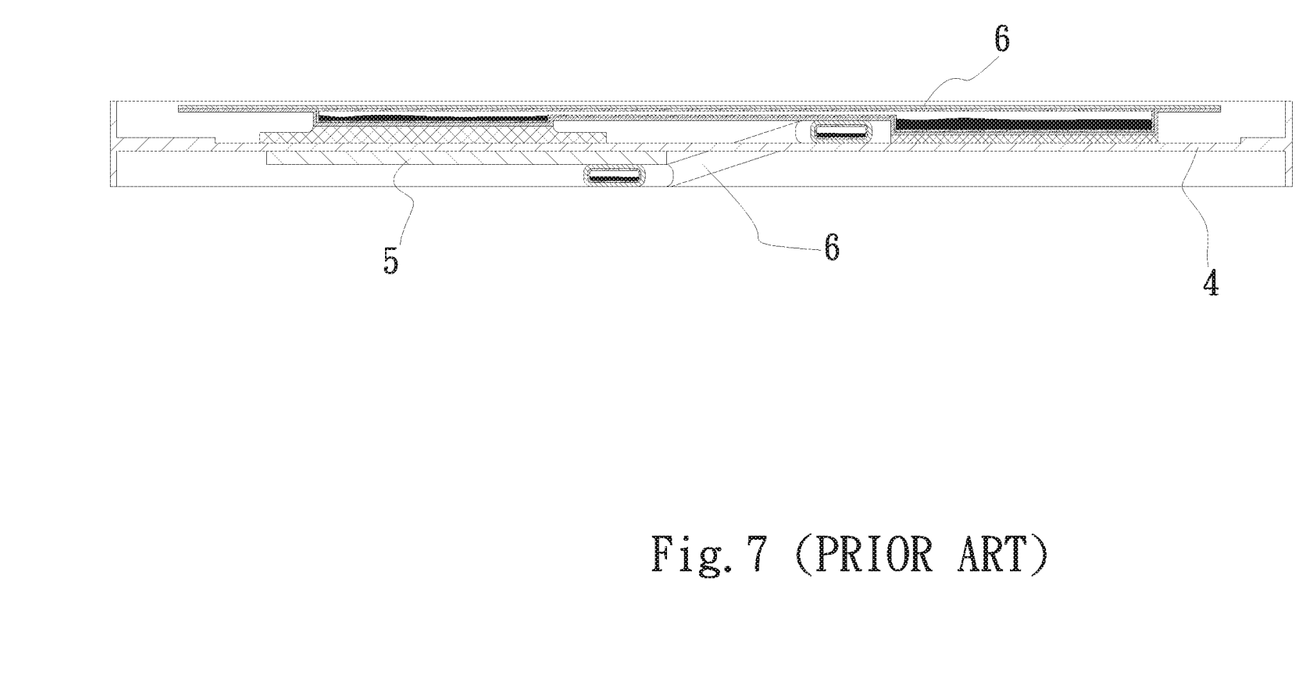
FIG. 7 is a sectional view of a conventional heat dissipation connection structure of handheld device.

Furthermore, as shown in FIG. 7, the conventional middle frame case 4 serves to support the various electronic components 5 and the heat dissipation or heat conduction component 6. In case that the material of the middle frame case 4 has poor heat conduction performance, it is necessary to employ the heat dissipation or heat conduction component 6 to help in conducting the heat. The heat dissipation or heat conduction component 6 must be first attached to the middle frame case 4 and then laminated with the electronic component 5 to conduct the heat. Accordingly, the total thickness and weight of the middle frame case 4 are increased and the effect of thinning and lightweight can be hardly achieved.

It is therefore tried by the applicant to provide a heat dissipation structure of handheld device, which is selectively made of different materials in combination with each other, whereby the different materials can provide respective necessary material properties to achieve the effect of lightweight and thinning. Moreover, the heat dissipation structure of handheld device can enhance the heat conduction efficiency as well as the structural strength of the handheld device.

SUMMARY OF THE INVENTION

It is therefore a primary object of the present invention to provide a heat dissipation connection structure of handheld device, in which an injection molding structure member made by means of integral insert injection molding is used as a connection structure to quickly connect the outer frame and the two-phase flow heat exchange unit of the handheld device.

To achieve the above and other objects, the heat dissipation connection structure of handheld device of the present invention includes an outer frame main body and a two-phase flow heat exchange unit.

The outer frame main body has at least one hollow receiving space. The outer frame main body surrounds the hollow receiving space. The two-phase flow heat exchange unit is disposed in the hollow receiving space and connected with the outer frame main body by means of an injection molding structure member.

In the case that the outer frame main body and the two-phase flow heat exchange unit are not an integrated structure, the injection molding structure member can be made by means of integral insert injection molding to integrally and quickly connect the outer frame main body and the two-phase flow heat exchange unit.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
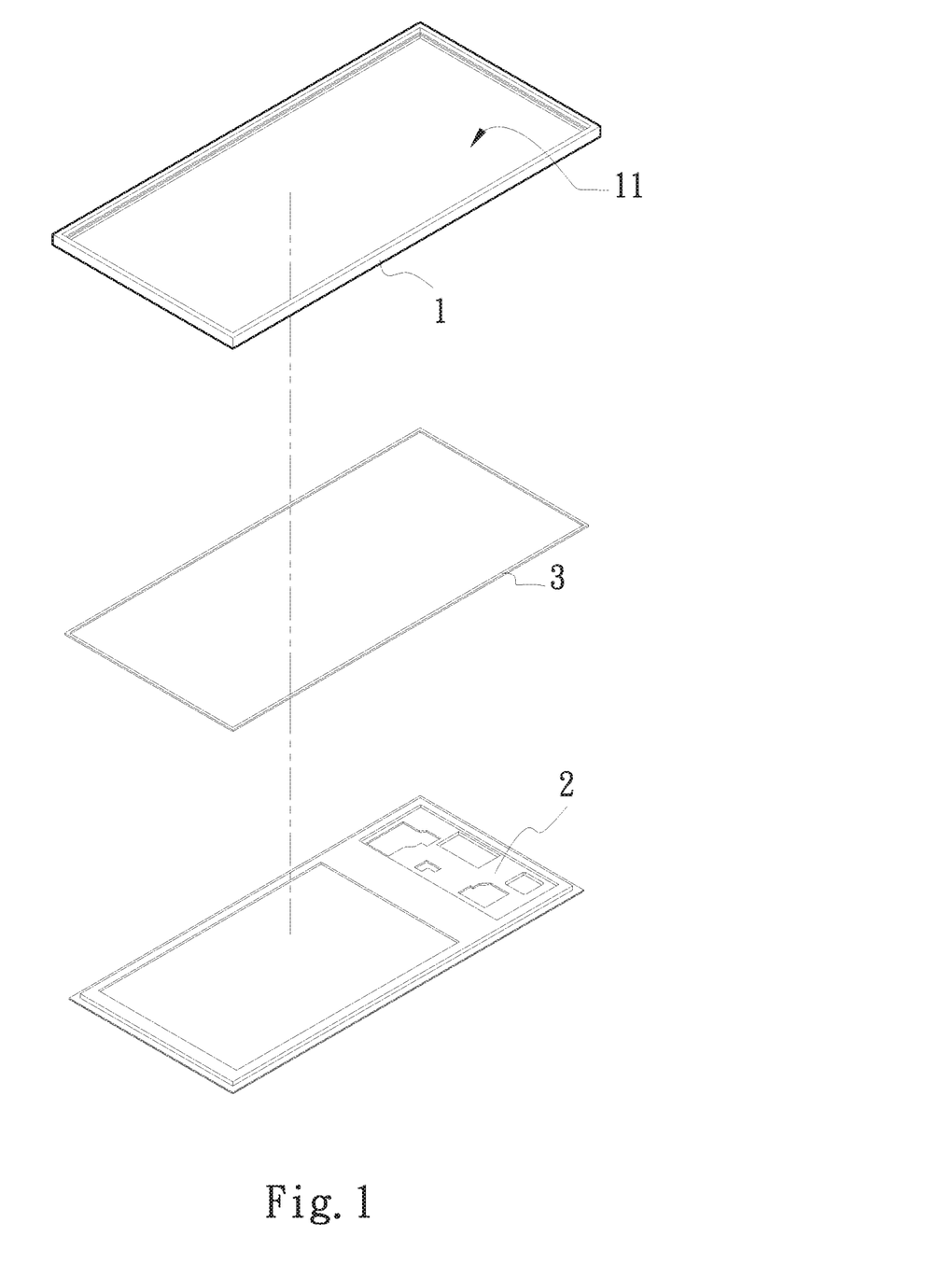
FIG. 1 is a perspective exploded view of a first embodiment of the heat dissipation connection structure of handheld device of the present invention.
Figure 2:
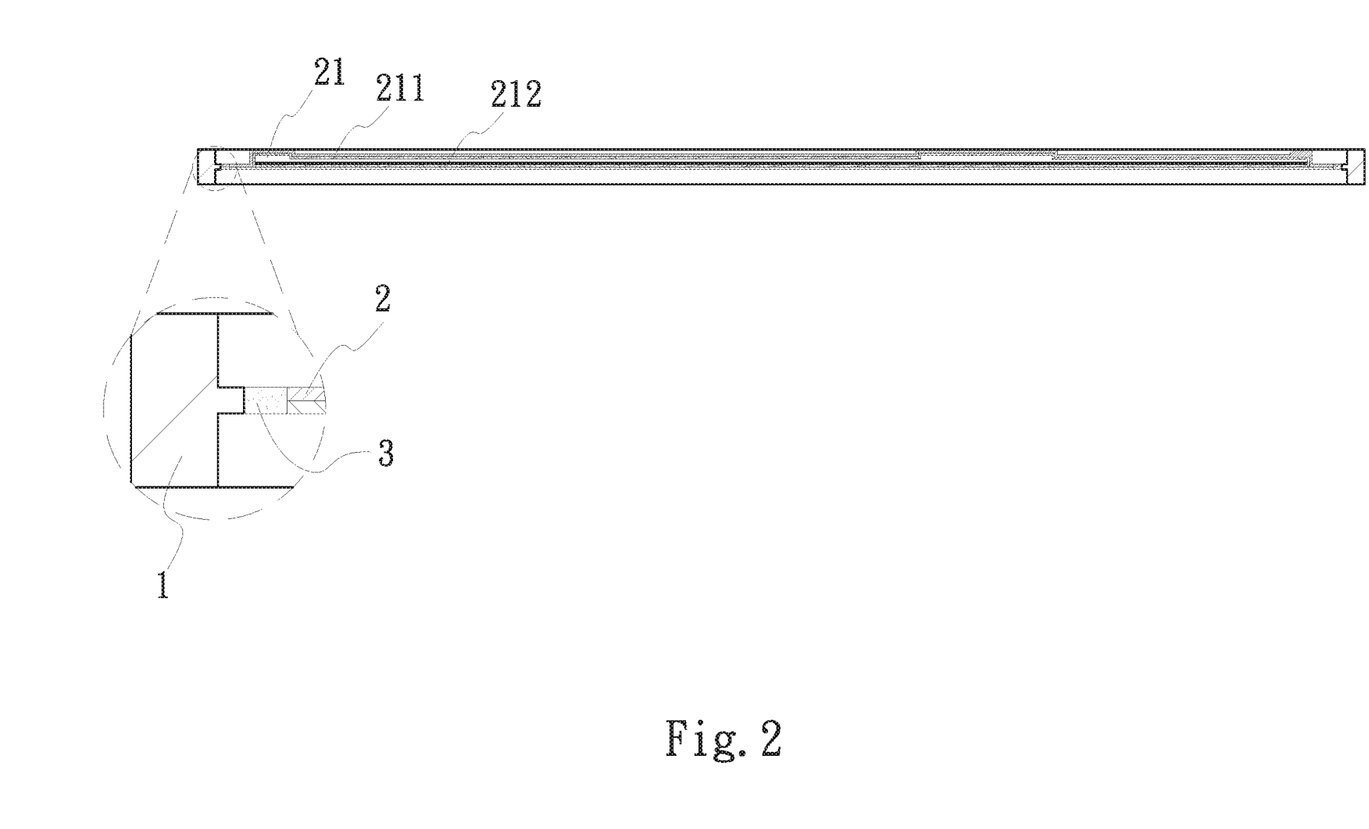
FIG. 2 is a sectional assembled view of the first embodiment of the heat dissipation connection structure of handheld device of the present invention.

Please refer to FIGS. 1 and 2. FIG. 1 is a perspective exploded view of a first embodiment of the heat dissipation connection structure of handheld device of the present invention. FIG. 2 is a sectional assembled view of the first embodiment of the heat dissipation connection structure of handheld device of the present invention. As shown in the drawings, the heat dissipation connection structure of handheld device of the present invention includes an outer frame main body 1 and a two-phase flow heat exchange unit 2.

The outer frame main body 1 has at least one hollow receiving space 11. In this embodiment, the outer frame main body 1 has the hollow receiving space 11 at the center. The hollow receiving space 11 has two open ends. The outer frame main body 1 surrounds the hollow receiving space 11.

The two-phase flow heat exchange unit 2 is disposed in the hollow receiving space 11 and connected with the outer frame main body 1 by means of an injection molding structure member 3. The two-phase flow heat exchange unit 2 has at least one airtight chamber 21. At least one capillary structure 211 is disposed in the airtight chamber 21. A working fluid 212 is filled in the airtight chamber 21. The two-phase flow heat exchange unit 2 is, but not limited to, a flat-plate heat pipe or a vapor chamber. In this embodiment, the two-phase flow heat exchange unit 2 is a vapor chamber for illustration purposes.

The injection molding structure member 3 is a structure member made by means of integral insert injection molding. The outer frame main body 1 and the two-phase flow heat exchange unit 2 are together placed into an injection mold (not shown) for integral injection molding. Thereafter, the injection molding structure member 3 is formed to connect the outer frame main body 1 with the two-phase flow heat exchange unit 2. The injection molding structure member 3 is made of plastic or metal.

The outer frame main body 1 and the two-phase flow heat exchange unit 2 can be made of the same material or different materials. The outer frame main body 1 and the two-phase flow heat exchange unit 2 are made of a material selected from a group consisting of copper, aluminum, stainless steel, ceramic, copper alloy, aluminum alloy, commercial pure titanium and titanium alloy.

Figure 3:
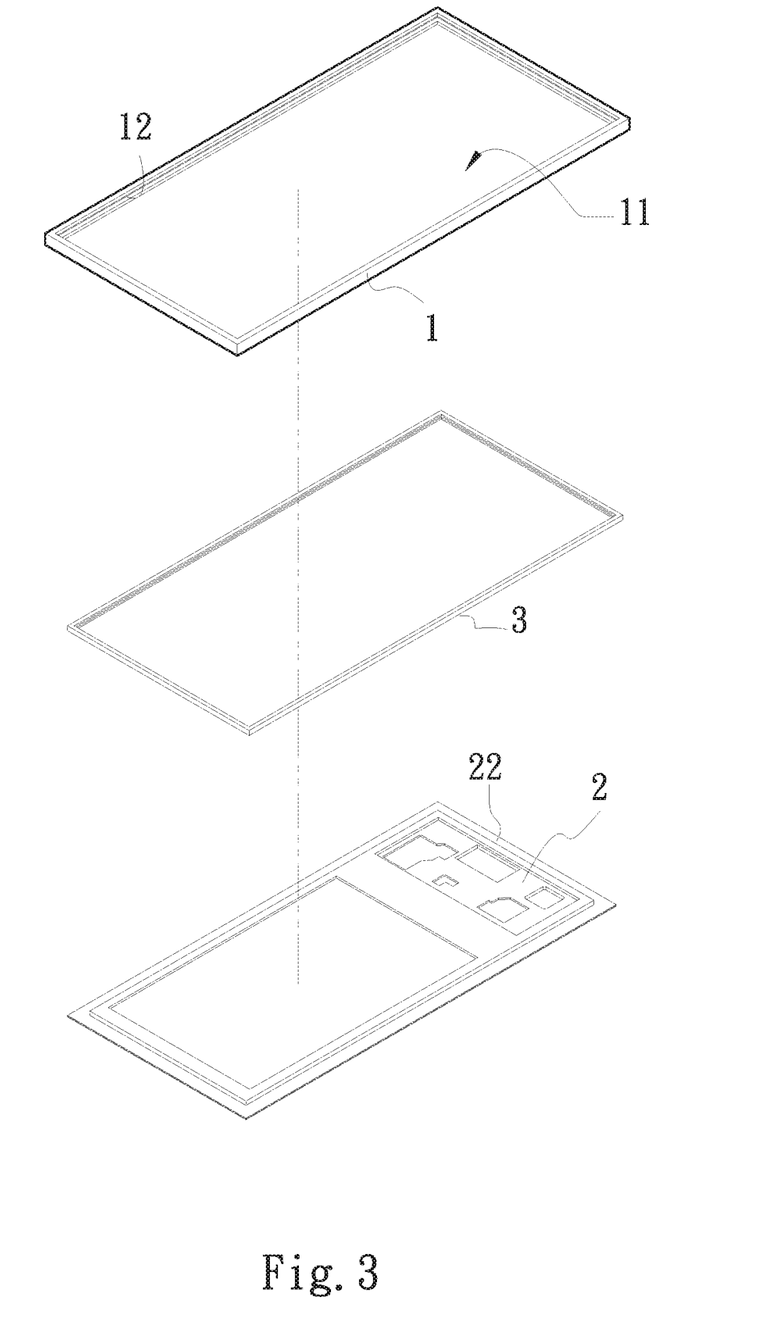
FIG. 3 is a perspective exploded view of a second embodiment of the heat dissipation connection structure of handheld device of the present invention.
Figure 4:
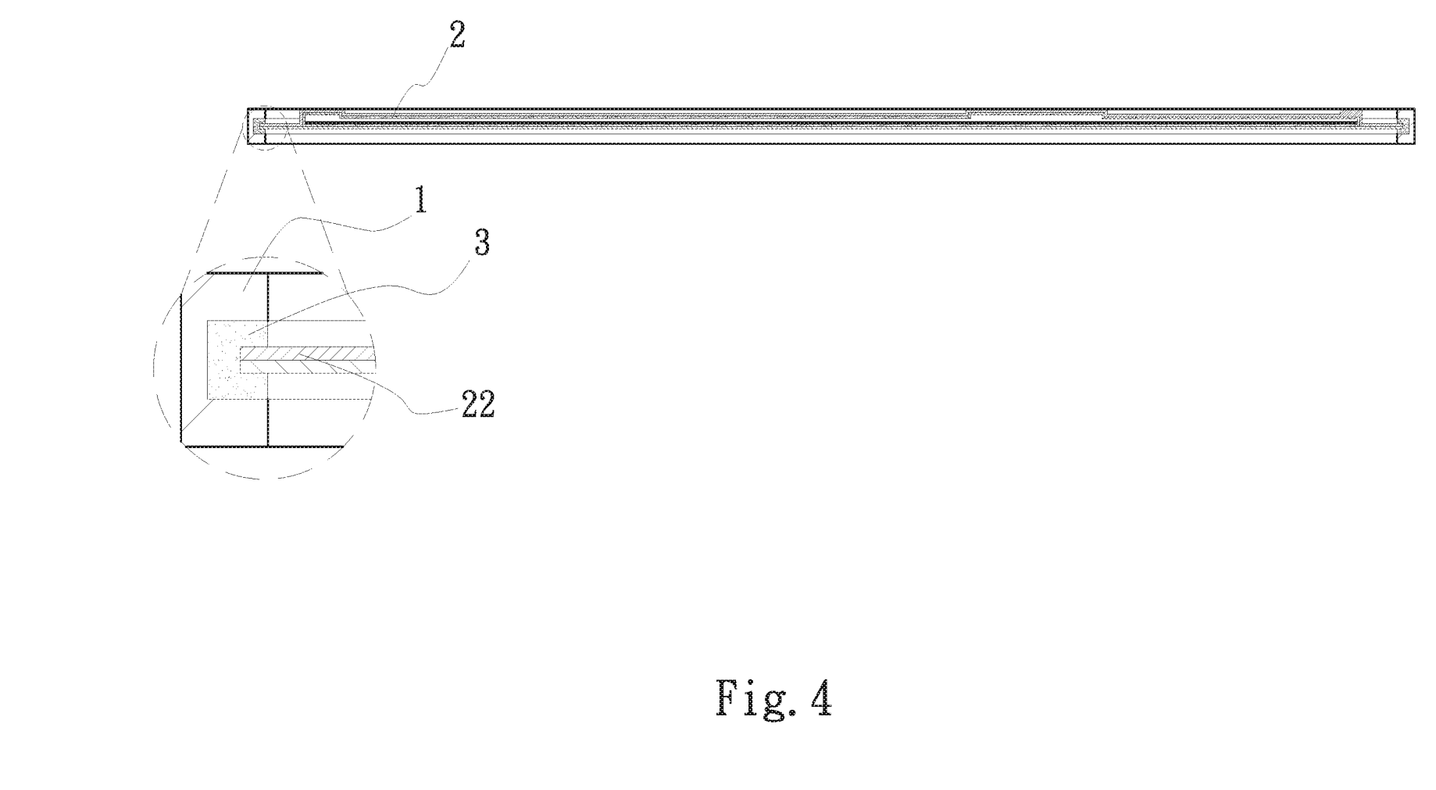
FIG. 4 is a sectional assembled view of the second embodiment of the heat dissipation connection structure of handheld device of the present invention.

Please refer to FIGS. 3 and 4. FIG. 3 is a perspective exploded view of a second embodiment of the heat dissipation connection structure of handheld device of the present invention. FIG. 4 is a sectional assembled view of the second embodiment of the heat dissipation connection structure of handheld device of the present invention. The second embodiment is partially identical to the first embodiment in structure and thus will not be redundantly described hereinafter. The second embodiment is different from the first embodiment in that an inner periphery of the outer frame main body 1 has a channel section 12. The two-phase flow heat exchange unit 2 is a vapor chamber. An outer periphery of the two-phase flow heat exchange unit 2 has a lip section 22. One end of the injection molding structure member 3 is inserted in the channel section 12 and the other end of the injection molding structure member 3 encloses the lip section 22. Accordingly, by means of the injection molding structure member 3, the outer frame main body 1 and the two-phase flow heat exchange unit 2 are securely connected with each other.

Figure 5:
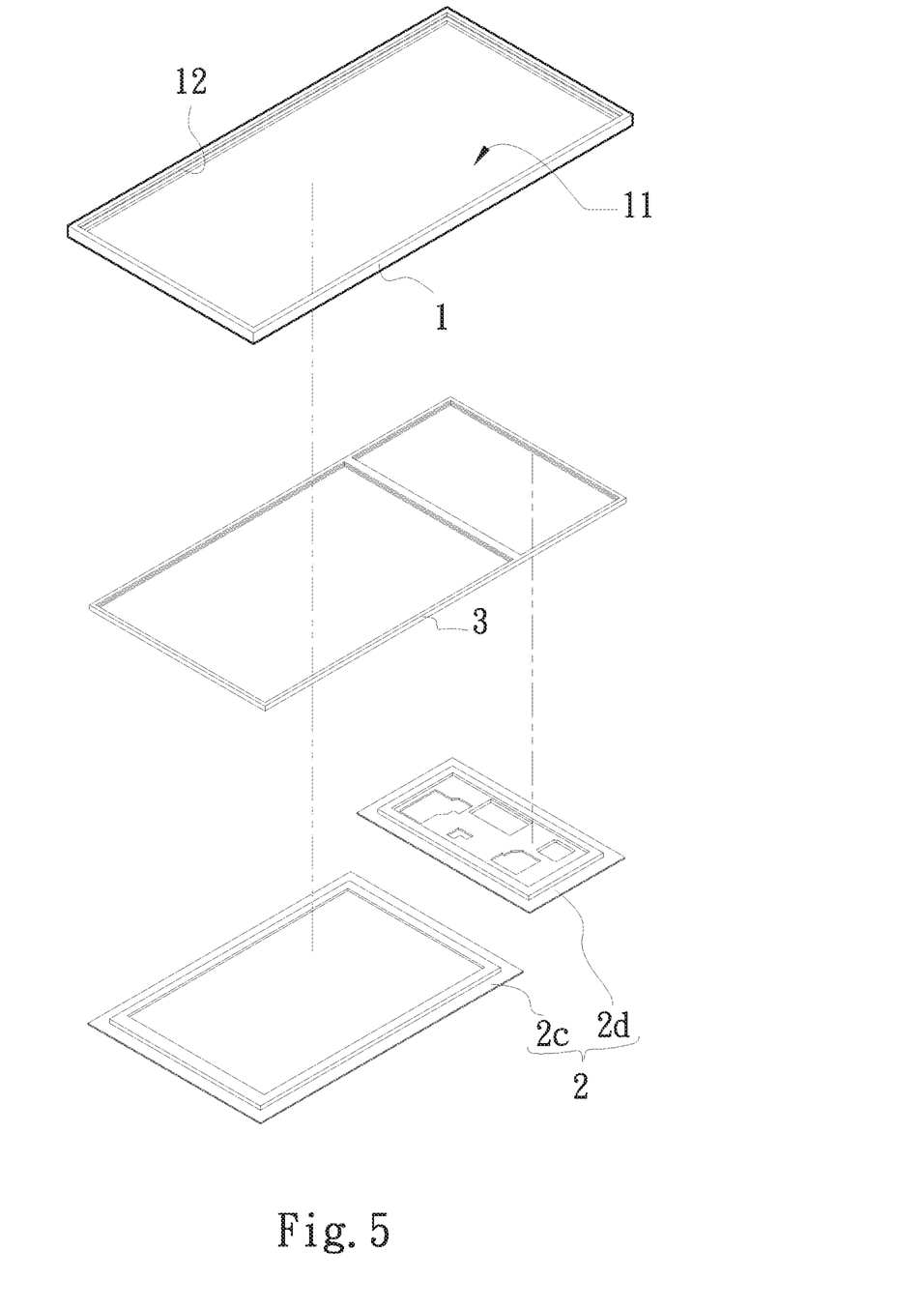
FIG. 5 is a perspective exploded view of a third embodiment of the heat dissipation connection structure of handheld device of the present invention.
Figure 6:
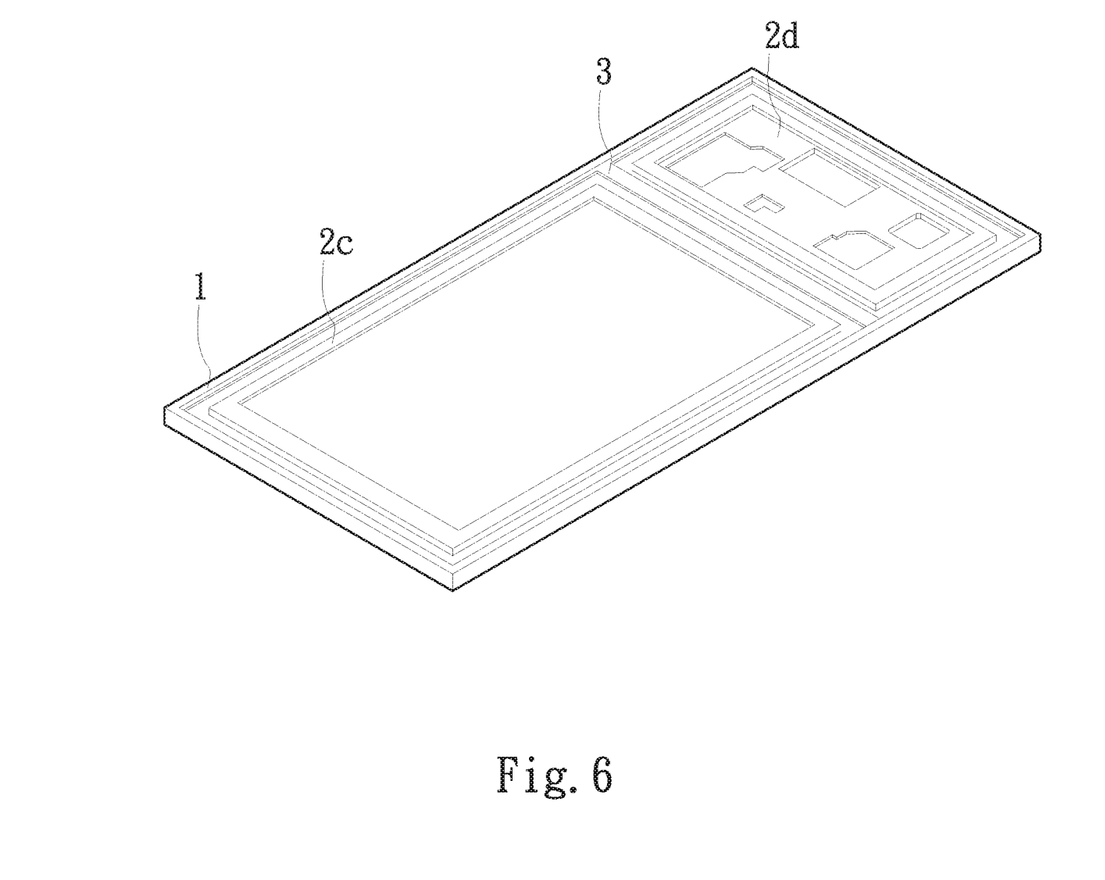
FIG. 6 is a perspective assembled view of the third embodiment of the heat dissipation connection structure of handheld device of the present invention.

Please refer to FIGS. 5 and 6. FIG. 5 is a perspective exploded view of a third embodiment of the heat dissipation connection structure of handheld device of the present invention. FIG. 6 is a perspective assembled view of the third embodiment of the heat dissipation connection structure of handheld device of the present invention. The third embodiment is partially identical to the second embodiment in structure and thus will not be redundantly described hereinafter. The third embodiment is different from the second embodiment in that the two-phase flow heat exchange unit 2 of the third embodiment is composed of a first vapor chamber 2c and a second vapor chamber 2d. The first and second vapor chambers 2c, 2d are respectively made of stainless steel and copper material. The first and second vapor chambers 2c, 2d can be first solely integrally connected with each other by means of the injection molding structure member 3. Alternatively, the first and second vapor chambers 2c, 2d and the outer frame main body 1 are at the same time securely connected with each other by means of the injection molding structure member 3. Therefore, the outer frame main body 1 and the two-phase flow heat exchange unit 2 (the first and second vapor chambers 2c, 2d) are securely connected by means of the injection molding structure member 3.

The primary object of the present invention is to respectively independently manufacture the outer frame main body 1 for enhancing the structural strength of the handheld device and the two-phase flow heat exchange unit 2 for supporting the electronic components and conducting the heat thereof. Thereafter, the injection molding structure member 3 is made by means of integral insert injection molding to integrally connect the outer frame main body 1 and the two-phase flow heat exchange unit 2. Accordingly, the two members of the outer frame main body 1 and the two-phase flow heat exchange unit 2 can be quickly, easily and securely assembled with each other. The injection molding structure member 3 serves to provide a heat insulation effect. Also, the present invention can greatly improve the shortcoming of the conventional integrated middle frame of the handheld device that only one single material property is provided and it is hard to process. In addition, the outer frame main body 1 and the two-phase flow heat exchange unit 2 of the present invention are respectively independently manufactured.

In the present invention, the outer frame main body 1 is assembled and connected with the two-phase flow heat exchange unit 2. Therefore, the two-phase flow heat exchange unit 2 with two-phase flow heat exchange effect can be directly used to support the electronic components and perform heat conduction work. In the precondition that the number of the heat transfer members is not increased and the thickness is not increased, the heat dissipation and heat transfer member can be omitted so that the total weight and thickness are greatly reduced to achieve the object of lightweight and thinning.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat dissipation connection structure of handheld device, comprising:
   a middle frame main body defining an aperture with an inner periphery, the middle frame main body surrounding the aperture, the inner periphery having a channel section; and
   a two-phase flow heat exchange unit being a vapor chamber with a lip section at an outer periphery of the vapor chamber, wherein an injection molding structure member encloses the lip section a periphery of the two-phase flow heat exchange unit, and wherein both the injection molding structure member and the lip section of the two-phase flow heat exchange unit are in the channel section of the middle frame main body, such that the two-phase flow heat exchange unit can be bonded to the middle frame main body and that the two-phase flow heat exchange unit can support an electronic componence and conduct heat from the electronic component.

2. The heat dissipation connection structure of handheld device as claimed in claim 1, wherein the injection molding structure member is a structure member made by means of integral insert injection molding, the middle frame main body and the two-phase flow heat exchange unit being together placed into an injection mold for integral injection molding, thereafter, the injection molding structure member being formed to connect the outer frame main body with the two-phase flow heat exchange unit.

3. The heat dissipation connection structure of handheld device as claimed in claim 1, wherein the injection molding structure member is made of plastic or metal.

4. The heat dissipation connection structure of handheld device as claimed in claim 1, wherein the two-phase flow heat exchange unit is a flat-plate heat pipe or a vapor chamber.

5. The heat dissipation connection structure of handheld device as claimed in claim 1, wherein the middle frame main body and the two-phase flow heat exchange unit are made of the same material or different materials.

6. The heat dissipation connection structure of handheld device as claimed in claim 1, wherein the middle frame main body and the two-phase flow heat exchange unit are made of a material selected from a group consisting of copper, aluminum, stainless steel, ceramic, copper alloy, aluminum alloy, commercial pure titanium and titanium alloy.

7. The heat dissipation connection structure of handheld device as claimed in claim 1, wherein the two-phase flow heat exchange unit has at least one airtight chamber, a capillary structure being disposed in the airtight chamber, a working fluid being filled in the airtight chamber.

8. The heat dissipation connection structure of handheld device as claimed in claim 1, wherein the two-phase flow heat exchange unit is at least composed of a first vapor chamber and a second vapor chamber, the first and second vapor chambers being integrally connected with each other by means of the injection molding structure member.

9. The heat dissipation connection structure of handheld device as claimed in claim 8, wherein the first and second vapor chambers are respectively made of stainless steel and copper material.

\* \* \* \* \*